Oct. 19, 1965 R. C. LANDGRAF ETAL 3,213,384
HIGH EFFICIENCY AUDIO AMPLIFIER UTILIZING PULSE WIDTH MODULATION
Filed Oct. 23, 1961 2 Sheets-Sheet 1
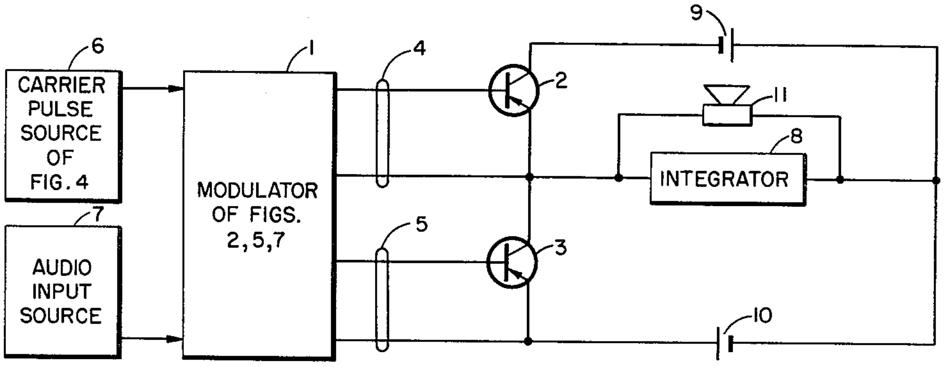
Fig. 1
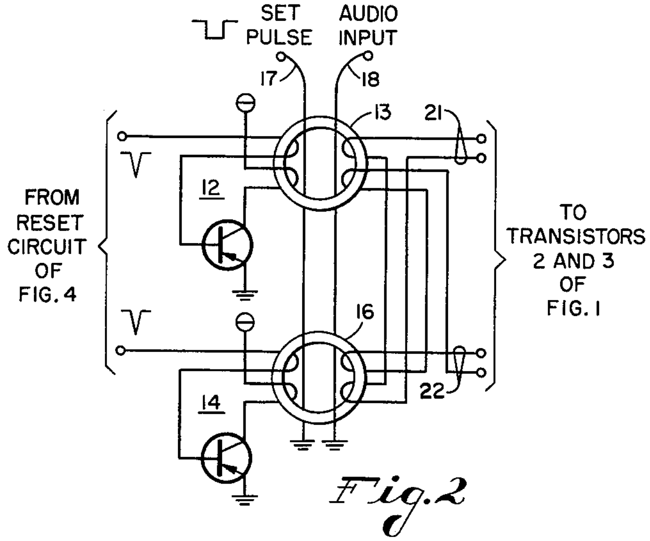
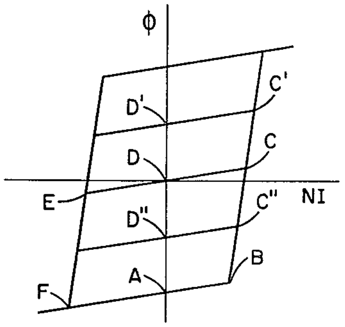
Fig. 2 Fig. 3
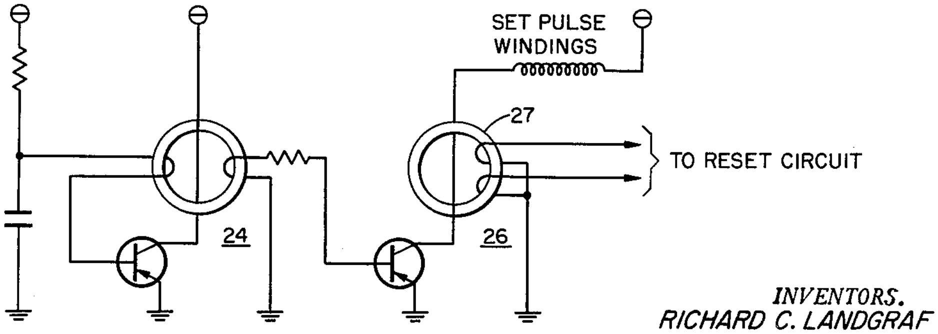
Fig. 4
INVENTORS.
RICHARD C. LANDGRAF
THOMAS PROCTOR
BY
Robert L. Nathans
ATTORNEY 3,213,384

HIGH EFFICIENCY AUDIO AMPLIFIER UTILIZING PULSE WIDTH MODULATION

Richard C. Landgraf and Thomas Proctor, Webster, N.Y., assignors to General Dynamics Corporation, Rochester, N.Y., a corporation of Delaware Filed Oct. 23, 1961, Ser. No. 146,912
8 Claims. (Cl. 330—10)

The present invention relates to high efficiency audio amplifiers.

Moderate and high power class A and class B operated audio amplifiers require high power transistors and large heat sinks for dissipating the heat generated by the transistors. Their efficiencies are in the neighborhood of 25% to 50% and relatively large power transformers are required in their output circuits. Accordingly, these amplifiers are heavy and comparatively bulky. A need exists for a transformerless power amplifier which dissipates small quantities of heat and, therefore, may be constructed within a small metal compartment affixed to a speaker housing.

Accordingly, it is the principal object of the present invention to provide a compact and reliable audio amplifier having an efficiency approaching 100%.

A further object of the present invention is to provide a new and improved audio amplifier which does not utilize a power transformer.

It is yet a further object of the present invention to provide a new and improved audio amplifier which utilizes low power transistors throughout.

Further objects and advantages of the invention will become apparent as the following description proceeds and the features of novelty which characterize the invention will be pointed out with particularity in the claims annexed to and forming a part of this specification.

For a better understanding of the invention, reference may be had to the accompanying drawings in which:

FIGURE 1 is a schematic diagram of the overall organization of an audio amplifier constructed in accordance with the present invention;

FIGURE 2 is a circuit diagram of a first type of modulator;

FIGURE 3 is a plot of a hysteresis loop which will aid in the understanding of the operation of the modulator of FIGURE 2;

FIGURE 4 is a circuit diagram of a carrier pulse source which may be utilized to drive the modulators;

Figures 5, 6, 7, 8, 9:
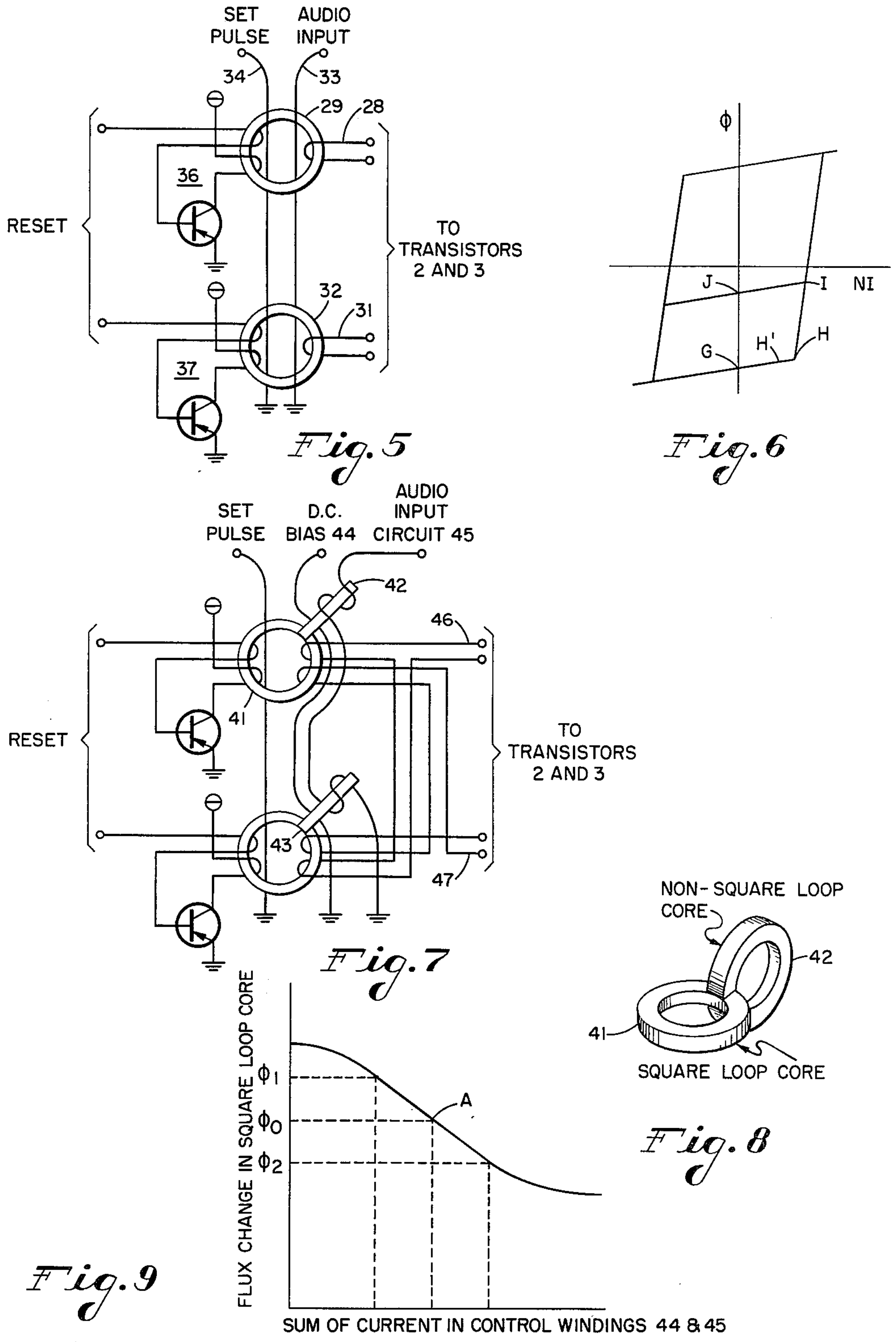
FIGURE 5 is a circuit diagram of a second type of modulator.
FIGURE 6 is a plot of a hysteresis loop which will aid in the understanding of the operation of the modulator of FIGURE 5.
FIGURE 7 is a circuit diagram of a third type of modulator.
FIGURE 8 is a perspective view of portions of the two core reactors utilized in the modulator of FIGURE 7.
FIGURE 9 is a plot of a curve which will aid in the understanding of the operation of the FIGURE 7 modulator.

As shown schematically in FIGURE 1 of the drawings, modulator 1 is coupled to the control circuits of transistors 2 and 3 through output circuits 4 and 5, respectively. Carrier pulse source 6 is coupled to modulator 1, and the audio signal produced by audio input source 7 is also introduced into the modulator. When the audio signal produced by source 7 is positive-going, negative-going pulses will be produced in output circuit 4 of modulator 1, the duration of which are proportional to the instantaneous amplitude of the positive-going audio signal. These negative-going pulses will control transistor 2 so that the transistor becomes saturated while each pulse is present in output circuit 4 and will be completely turned off when these pulses are absent from output circuit 4. When transistor 2 is rendered conductive, current flows through integrator 8 owing to D.C. source 9. It should be apparent that the greater the instantaneous amplitude of the audio signal introduced into modulator 1, the greater the widths of the pulses applied to transistor 2 and, accordingly, the greater the voltage produced across integrator 8. A speaker or other load device 11 may be connected across integrator 8, or in series with it, to utilize the amplified audio signal. Where the audio signal is negative-going, a train of negative-going pulses will be produced in output circuit 5 of modulator 1 to control transistor 3 in a similar manner mentioned hereinbefore in connection with the control of transistor 2. When transistor 3 becomes saturated during the application of the negative-going pulse width modulated impulses produced in output circuit 5, current will flow through integrator 8 in a direction opposite to the direction of current flow produced by the actuation of transistor 2 owing to battery 10.

It should, therefore, be apparent that a positive-going audio signal will cause current to flow in a first direction through integrator 8 and a negative-going audio signal will produce a current through integrator 8 in a second direction. The greater the instantaneous amplitude of the audio input signal, the greater the duty cycle of the control pulse train and, therefore, the greater the voltage built up across integrator 8 and applied to load device 11. The frequency of operation of carrier pulse source 6 should be in the neighborhood of two and one-half times the highest audio frequency which is to be reproduced at the load device.

FIGURE 2 discloses a first type of modulator which may be utilized to practice the present invention. A first blocking oscillator 12 includes a first core 13 which has a hysteresis loop similar to that shown in FIGURE 3. Similarly, blocking oscillator 14 includes a second core 16 which has magnetic characteristics similar to those of core 13. In the reset condition, both cores are at point A of FIGURE 3. A set pulse produced by carrier pulse source 6 is applied to set circuit 17 and, in the absence of an audio signal in audio circuit 18, will cause the cores to traverse the path A, B, C and D, shown in FIGURE 3. Upon the termination of the set pulse, reset pulses are applied so that blocking oscillators 12 and 14 are simultaneously operated to reset each core over the path D, E, F and A, shown in FIGURE 3. It should be noted that output circuit 21 includes two oppositely wound series connected coils both having an equal number of turns and, in like manner, output circuit 22 similarly includes two oppositely wound series connected coils, both having an equal number of turns, as shown. It is well known that the greater the change in flux in a square loop core, the greater the width of the pulse produced due to the reset operation. Since the change in flux during a cycle of operation in core 13 will be the same as the change in flux in core 16, it follows that the duration of the pulses produced across the series connected windings of output circuits 21 and 22 will be equal and, since these windings are oppositely wound, no output signals will be produced in circuits 21 and 22 under this condition. Now let it be assumed that a positive-going audio signal is applied to circuit 18. Since this circuit comprises windings wound about the cores in an opposite sense, as shown, core 13 will traverse the path A, B, C′ and D′ during the setting period, while core 16 will traverse the path A, B, C″ and D″. During the reset operation, the change in flux in core 13 will be considerably greater than the change in flux in core 16 and, accordingly, the impulses produced in the output windings of core 13 will have a greater duration than the duration of the impulses produced in the output windings of core 16. The magnetic materials are selected so that the difference between the fluxes induced in each core is proportional to the strength of the audio input signal. During the interval when the flux is changing in both cores, no output signal will be produced in circuits 21 and 22. However, when core 16 becomes reset, the flux will still be changing in core 13 and, accordingly, a negative-going impulse will be produced across output circuit 21. Although any square loop cores may be utilized, best results were attained by using nickel iron tape wound cores.

In summary, the greater the instantaneous amplitude of the positive audio wave applied to audio circuit 18, the greater the flux change within core 13 compared to core 16 and, therefore, the greater the widths of the negative-going impulses produced in output circuit 21. Output circuit 21 is coupled to the control circuit of transistor 2, while output circuit 22 is coupled to the control circuit of transistor 3, as shown in FIGURE 1. The aforementioned negative-going impulses produced in output circuit 21, whose width is a function of the instantaneous amplitude of the positive-going audio signal, directly control the amounts of energy which are introduced into integrator 8 by virtue of power supply 9. The positive-going impulse produced in output circuit 22 concurrently with the production of the aforementioned negative-going impulse in output circuit 21 will have no effect on transistor 3.

Where the audio input signal applied to audio circuit 18 is negative, the flux changes produced during the reset interval in core 16 will be greater than the flux changes produced in core 13 and, accordingly, negative impulses are produced in output circuit 22 whose width is proportional to the difference in the flux changes in the two cores. These impulses are applied to the control circuit of transistor 3, as shown in FIGURE 1. However, it should be noted that due to the polarity of source 10, the saturation of transistor 3 will produce current flow through integrator 8 in a direction opposite to the direction of current flow produced in integrator 8 by saturating transistor 2. This change in direction will, of course, tend to reverse the polarity of the voltage produced across integrator 8 and applied to the load device 11. The amplitudes of the transistor control pulses are sufficient to saturate the transistors virtually upon application.

A typical carrier pulse source 6, which is utilized to set and reset the cores of the modulator, is shown in FIGURE 4. Blocking oscillator 24 controls amplifier 26 and is connected as shown in FIGURE 4. The operating frequency of oscillator 24 should be at least twice the frequency of the highest audio signal to be amplified, according to the Nyquist criteria. The rectangular set pulse is produced by collector current flowing through the set windings. The trailing edge of the set pulse is differentiated by windings 27 to produce the negative-going reset impulses simultaneously applied to blocking oscillators 12 and 14 for resetting the cores.

FIGURE 5 shows a second type of modulator which may be utilized in the amplifier of the present invention. The set, reset, and audio input windings are similar to those of the modulator shown in FIGURE 2. A single output winding 28 is inductively coupled to core 29, as shown, and is directly coupled to the control circuit of transistor 2. In like manner, winding 31 is inductively coupled to core 32 and is directly connected to the control circuit of transistor 3 of FIGURE 1.

FIGURE 6 shows a hysteresis loop which represents the magnetic characteristics of cores 29 and 32. The parameters of the set pulse circuit 34 are adjusted to produce a magnetomotive force which causes the cores to assume a state, represented by point H of FIGURE 6, in the absence of an audio signal being applied to audio input circuit 33. Under these conditions, there will be no non-elastic flux switched in the cores and when blocking oscillators 36 and 37 are triggered by the reset pulses, they will not regenerate so that no output will be present in either winding 28 or winding 31. If a positive audio signal is applied to audio input circuit 33 during the set period, it will increase the magnetomotive force applied to core 29 so that core 29 traverses a path, such as G, H, I and J. However, since the windings of the audio input circuit 33 are oppositely wound in conjunction with the cores, the magnetomotive force induced in core 32 will prevent any regeneration in the core since no non-elastic flux is produced in the core. In other words, core 32 would traverse the path G, H′, G and, in fact, would not reach the knee of the curve represented by point H. Accordingly, upon the application of the reset pulses to blocking oscillators 36 and 37, a non-elastic flux change will be produced within core 29, the amount of which will be proportional to the instantaneous amplitude of the positive audio signal applied to the audio input circuit 33. Again, the greater this flux change, the greater will be the duration of the negative-going output impulse produced across winding 28. Where the audio input signal is negative, the situation is reversed so that a negative signal is produced across winding 31 and no signal is produced across winding 28. Output winding 28 is directly connected to the control circuit of transistor 2, shown in FIGURE 1, and output winding 31 is directly connected to the control circuit of transistor 3 of the same figure.

A third type of modulator which may be utilized in the amplifier of the present invention is disclosed in FIGURE 7. A core having a substantially square hysteresis loop 41 is joined to a non-square loop core 42, as shown in FIGURE 8. These cores may be readily joined according to the wet welding process disclosed in the patent application of Lewis O. Jones, Serial No. 140,505, filed September 25, 1961 and assigned to the same assignee as the present invention and now abandoned. The resulting composite core may be termed a cross-field reactor since the field generated in core 42 cuts across the field generated in core 41. The composite core structure 43 is identical to the core structure comprising cores 41 and 42. It is well known that the greater the flux present in the non-square loop core, the less the change in flux in the square loop core when the square loop core is switched by a fixed magnetomotive force. It follows, therefore, that D.C. bias circuit 44 and audio input circuit 45 constitute a control circuit for controlling the change in flux which will be produced in the square loop cores. In the absence of a signal in audio input circuit 45, the D.C. bias is adjusted to induce a flux of $\phi_0$ which is positioned in the center of the linear portion of the curve shown in FIGURE 9 at point A. Under this condition, the setting and resetting of the square loop cores will produce a flux change $\phi_0$, as shown in FIGURE 9. Since the input and output circuitry of the modulator of FIGURE 7 is similar to the input and output circuitry of the modulator disclosed in FIGURE 2 and, since the same flux change $\phi_0'$ will be induced in both cores under this condition, no output signal will be produced across output circuits 46 and 47.

Now let it be assumed that a positive audio signal is applied to audio input circuit 45. Since the audio windings are equal and opposite, as shown, the effect of this signal will subtract from the effect of the bias signal in core 42 and will add to the effect of the bias signal in core 43. Accordingly, the setting and resetting process will cause a flux change of $\phi_1$ in core 41 and will cause a flux change of $\phi_2$ in core 43 and, accordingly, an output signal will be produced in output circuit 46 as in the case of the modulator of FIGURE 2. On the other hand, a negative audio signal will cause core 41 to experience a flux change $\phi_2$ and core 43 to experience a flux change $\phi_1$, which will cause a signal to be produced in output 47 in the same manner as the modulator of FIGURE 2. The cross-field core configurations are designed so that the curve of FIGURE 9 is substantially linear within the operating range, as shown. Since the audio windings need not be crowded on the square loop cores, in the FIGURE 7 modulator, less current is needed to drive the cores since more turns may be utilized.

It should be obvious that the present invention is not confined to square loop core configurations, as disclosed, but may be practiced with capacitor storage elements, which elements produce variable width pulses upon being discharged and which are charged to an extent depending upon the strength of the audio input signal. A steering circuit would be provided to charge-up the appropriate capacitor depending upon the polarity of the audio input signal.

In summary, the present invention provides an audio amplifier which does not require a power transformer in its output circuit due to the low impedance of transistors 2 and 3 when they are operated in saturation. Since the absence of an audio input signal will produce a no output condition in the modulators of the present invention, transistors 2 and 3 will not be operated so that power dissipation in the output circuit is zero under this condition. The transistors 2 and 3 are operated only during part of the cycle and when they are operated, they are operated in a saturated condition so that the power dissipation of the amplifier is minimized, which leads to greater reliability and compactness. In addition, the amplifier is responsive to D.C. current since the modulators are D.C. responsive. The efficiency of the amplifier approaches 100%.

While there has been disclosed what is at present considered to be the preferred embodiments of the invention, other modifications will readily occur to those skilled in the art. It is not, therefore, desired that the invention be limited to the specific arrangements shown and described, and it is intended in the appended claims to cover all such modifications as fall within the true spirit and scope of the invention.

What is claimed is:

1. An amplifier comprising a signal source, means for generating a first train of pulses, modulating means having a first and second input circuit and a first and second output circuit for producing a second train of pulse width modulated pulses of one polarity in said first output circuit but not in said second output circuit when the polarity of the signal produced by said signal source is positive and for producing a third train of pulse width modulated pulses of said one polarity in said second output circuit but not in said first output circuit when the polarity of the signal produced by said one polarity signal source is negative, the width of the pulses in said second and third trains being proportional to the instantaneous amplitude of the signal produced by said signal source, means for coupling said signal source to the first input circuit of said modulating means, means for applying said first train of pulses to the second input circuit of said modulating means, an integrating device, a power supply, a first switch having a control circuit connected to said first output circuit and operated in response to the pulses in said second train for coupling said power supply to said integrating device for the duration of each of said pulses of said second train to cause current flow through said integrating device in a first direction, and a second switch having a control circuit connected to said second output circuit and operated in response to the pulses of said third train for coupling said power supply to said integrating device for the duration of each of said pulses of said third train to cause current to flow through said integrating device in a second direction opposite to said first direction.

2. The invention as set forth in claim 1 wherein said first and second switches assume very high impedance states when unoperated and very low impedance states when operated in response to said width modulated pulses.

3. The invention as set forth in claim 1 wherein said means for modulating includes a pair of cores, and means for periodically causing flux changes in at least one of said cores proportional to the amplitudes of the signals produced by said signal source.

4. The invention as set forth in claim 2 wherein said means for modulating includes a pair of cores, and means for periodically causing flux changes in at least one of said cores proportional to the amplitudes of the signals produced by said signal source.

5. In combination, a first and second core, a signal source for producing signals having first and second polarities, means for setting and resetting said cores at a rate higher than the rate of alternation of polarity of said source signals between said first and said second polarities, means coupled to said signal source for periodically producing a flux change in at least one of said cores while said cores are being reset proportional to the strength of the signal produced by said signal source, and first and second output circuits magnetically coupled to said cores to derive pulse width modulated pulses of said one polarity only in said first output circuit and not in said second output circuit when the signal produced by said signal source has a first polarity and to derive pulse width modulated pulses of said one polarity only in said second output circuit and not in said first output circuit when the signal produced by said signal source has a second polarity.

6. In combination, a first core, a second core, a first output winding magnetically coupled to said first core, a second output winding magnetically coupled to said second core, a signal source which may produce signals of both positive and negative polarity, means for setting and resetting said cores at a rate higher than the rate of alternation of polarity of said source signals between said first and said second polarities and means coupled to said signal source for periodically producing while said cores are being reset a flux change in said first core but not in said second core in response to a signal of a first polarity produced by said signal source and for periodically producing while said cores are being reset a flux change in said second core but not in said first core in response to a signal of a second polarity produced by said signal source, the aforementioned flux changes being proportional to the strength of the signals produced by said signal source.

7. In combination, a first core, a second core, an output circuit including a first winding on said first core and a second winding on said second core, said second winding being wound in an opposite sense to said first winding and connected in series with said first winding, means for setting and resetting said cores at a rate higher than the highest frequency of said source signals a signal source, and means coupled to said signal source for periodically producing while said cores are being reset a first flux change in said first core and a second flux change in said second core, the difference between the flux changes being proportional to the strength of the signal produced by said signal source so that pulse width modulated pulses are produced in said output circuit.

8. In combination, a first core, a second core, a first output circuit including a first winding magnetically coupled to said first core and a second winding magnetically coupled to said second core, said second winding being wound in an opposite sense to said first winding and connected in series with said first winding, a second output circuit including a third winding magnetically coupled to said first core and a fourth winding magnetically coupled to said second core and connected in series with said third winding, said fourth winding being wound in an opposite sense to said third winding and said third winding being wound in an opposite sense to said first winding, a signal source for producing signals having first and second polarities, means for setting and resetting said cores at a rate higher than the rate of alternation of polarity of said source signals between said first and said second polarities, and means coupled to said signal source for periodically producing while said cores are being reset a first flux change in said first core and a second flux change in said second core, the difference between the flux changes being proportional to the strength of the signal produced by said signal source and said first flux change being greater than said second flux change when the signal produced by said signal source is of a first polarity and said first flux change being less than said second flux change when the signal produced by said signal source is of a second polarity.

References Cited by the Examiner

UNITED STATES PATENTS

| | | | |
|---|---|---|---|
| 2,955,264 | 10/60 | Kihn et al. | 332—12 |
| 3,018,445 | 1/62 | Stone | 330—18 X |
| 3,054,066 | 9/62 | Crane | 330—1 X |

ROY LAKE, *Primary Examiner.*

NATHAN KAUFMAN, *Examiner.*